(12) United States Patent
Chidambarrao et al.

(10) Patent No.: US 7,632,724 B2
(45) Date of Patent: Dec. 15, 2009

(54) STRESSED SOI FET HAVING TENSILE AND COMPRESSIVE DEVICE REGIONS

(75) Inventors: Dureseti Chidambarrao, Weston, CT (US); William K. Henson, Peekskill, NY (US); Yaocheng Liu, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 156 days.

(21) Appl. No.: 11/673,716

(22) Filed: Feb. 12, 2007

(65) Prior Publication Data

US 2008/0191281 A1    Aug. 14, 2008

(51) Int. Cl.
*H01L 21/00* (2006.01)
(52) U.S. Cl. .................. 438/153; 438/154; 257/E21.63
(58) Field of Classification Search .................. 438/153, 438/154, 199
See application file for complete search history.

(56) References Cited

U.S. PATENT DOCUMENTS

| | | | |
|---|---|---|---|
| 7,432,149 B2 * | 10/2008 | Wu et al. ..................... | 438/222 |
| 2005/0285187 A1 | 12/2005 | Bryant et al. | |
| 2006/0001089 A1 * | 1/2006 | Bedell et al. ................. | 257/347 |
| 2006/0049429 A1 | 3/2006 | Kim et al. | |
| 2006/0214232 A1 * | 9/2006 | Chen et al. .................. | 257/351 |
| 2007/0026629 A1 | 2/2007 | Chen et al. | |
| 2008/0191285 A1 * | 8/2008 | Ko et al. ..................... | 257/369 |

OTHER PUBLICATIONS

International Search Report and Written Opinion in PCT/US2008/053152 mailed May 22, 2008.

* cited by examiner

*Primary Examiner*—Phat X Cao
*Assistant Examiner*—Nga Doan
(74) *Attorney, Agent, or Firm*—Daryl K. Neff; H. Daniel Schnurmann

(57) ABSTRACT

A method is provided for fabricating a field effect transistor ("FET") having a channel region in a semiconductor-on-insulator ("SOI") layer of an SOI substrate. Desirably, in such method, a sacrificial stressed layer is formed to overlie a first portion of an active semiconductor region but not overlie second portion of the active semiconductor region which shares a common boundary with the first portion. After forming trenches in the SOI layer, the SOI substrate is heated with the stressed layer thereon sufficiently to cause the stressed layer to relax, thereby causing the stressed layer to apply a first stress to the first portion and to apply a second stress to the second portion. For example, when the first stress is tensile, the second stress is compressive, or the first stress can be compressive when the second stress is tensile. Desirably, the stressed layer is then removed to expose the first and second portions of the active semiconductor region. Desirably, the field effect transistor ("FET") is formed to include (i) a source region in the first portion, (ii) a drain region in the first portion, and (iii) a channel region in the second portion.

20 Claims, 9 Drawing Sheets

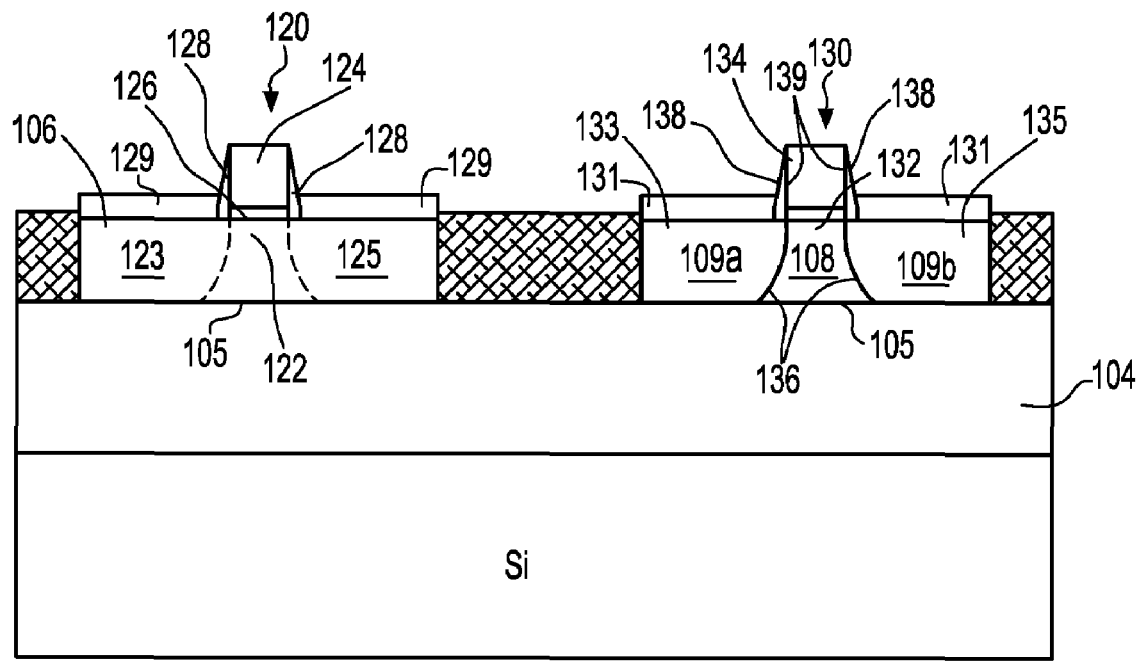
FIG.3  PFET  NFET
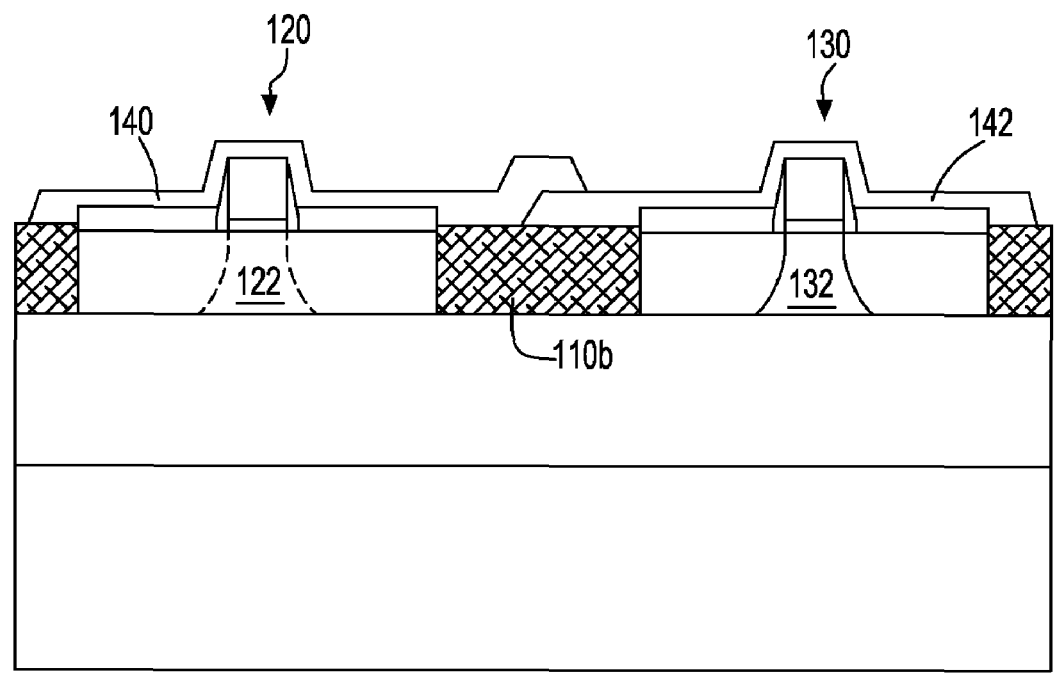
FIG. 4  PFET  NFET

STRESSED SOI FET HAVING TENSILE AND COMPRESSIVE DEVICE REGIONS

BACKGROUND OF THE INVENTION

The present invention relates to semiconductor devices and their fabrication. More particularly, the invention relates to preparation of a silicon-on-insulator ("SOI") substrate in which at least a portion of the SOI substrate is stressed.

Various methods exist for fabricating SOI substrates. In one particular example according to the prior art, illustrated in FIG. 1, an SOI substrate 10 is fabricated to contain a region of strained silicon 12 having tensile stress in which a transistor, for example, an n-type field effect transistor ("NFET") will be formed. The tensile stressed silicon region 12 overlies a region 14 containing silicon germanium (SiGe) having relaxed stress, and the SiGe region, in turn, overlies a bulk silicon region 18, as separated therefrom by a buried oxide ("BOX") layer 16 containing borophosphosilicate glass ("BPSG").

To fabricate the prior art SOI substrate 10, a starting SOI substrate is provided which includes a compressive top SiGe layer which overlies the bulk silicon layer 18, separated therefrom by a BOX layer including BPSG. Thereafter, a layer of silicon 12 is grown epitaxially from the surface of the SiGe layer. After patterning the silicon layer 12 and SiGe layer 14, e.g., by etching in accordance with a photolithographically defined mask layer (not shown), the temperature of the SOI substrate is elevated to a point at which the BPSG BOX layer 16 becomes flowable. This then causes the BOX layer 16 to soften and "flow". As a result, the stress in the SiGe layer 14 relaxes, and in consequence, a tensile stress develops in the silicon layer 12 above the SiGe layer 14.

One of the drawbacks of the prior art SOI substrate 10 is that after the active silicon region 12 is defined, the SiGe stressor layer 14 continues to underlie the active silicon region 12 in which the transistor is to be formed. This fact hinders some of the flexibility of the design of the transistor to be formed thereon, as the underlying SiGe layer 14 can contribute to junction capacitance, reducing the performance benefit to be gained from the SOI structure. In addition, the permanent presence of the SiGe layer 14 can lead to undesirable diffusion of germanium and arsenic into portions of the transistor to be formed in the active silicon region 12. Another drawback is that threading defects can occur which can lead to shorts of the gate dielectric.

SUMMARY OF THE INVENTION

According to an aspect of the invention, a method is provided for fabricating a field effect transistor ("FET") where the FET has a channel region in a monocrystalline silicon semiconductor-on-insulator ("SOI") layer of an SOI substrate which includes (i) the SOI layer separated from (ii) a bulk semiconductor layer by (iii) a buried dielectric layer including a flowable dielectric material. Desirably, a sacrificial stressed layer is formed to overlie a first portion of an active semiconductor region, the stressed layer not overlying a second portion of the active semiconductor region having a common boundary with the first portion. After forming trenches extending through the stressed layer into the SOI layer, the SOI substrate is heated with the stressed layer thereon sufficiently to cause the stressed layer to relax, thereby causing the stressed layer to apply a first stress to the first portion and to apply a second stress to the second portion. The first stress is one of tensile or compressive, the second stress is one or tensile or compressive but other than that of the first stress. A dielectric material can then be deposited into the trenches to form isolation regions. Desirably, the stressed layer is then removed to expose the first and second portions of the active semiconductor region. The field effect transistor ("FET") is formed to include (i) a source region in the first portion, (ii) a drain region in the first portion, and (iii) a channel region in the second portion.

BRIEF DESCRIPTION OF THE DRAWINGS

FIG. 3 is a sectional view illustrating field effect transistors ("FETs") provided in a stressed SOI substrate in accordance with an embodiment of the invention.

FIG. 4 is a sectional view illustrating a variation of the embodiment illustrated in FIG. 3 in which stressed dielectric liners overlie the FETs.

DETAILED DESCRIPTION

Figure 1:
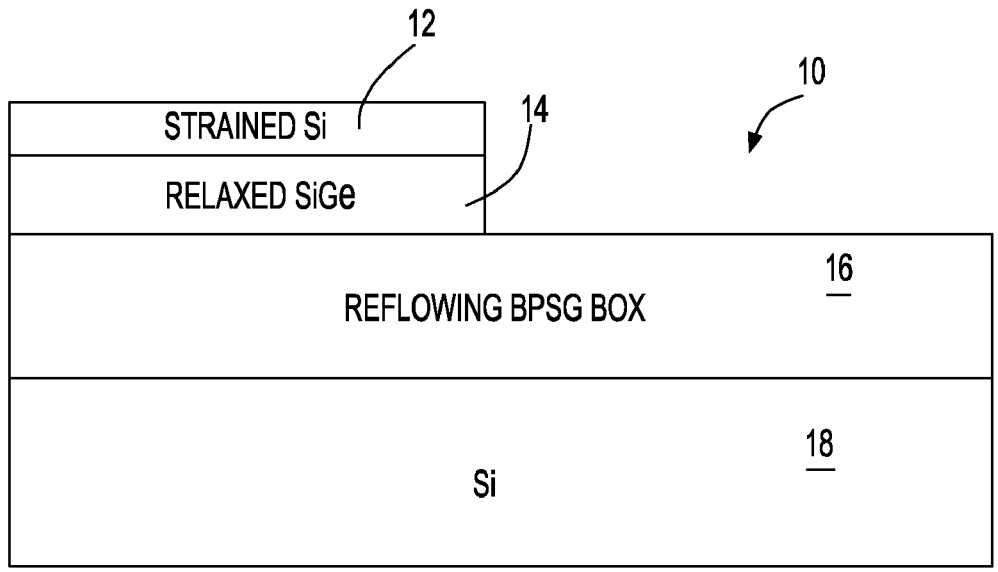
FIG. 1 is a sectional view illustrating a structure and method of fabricating a SOI substrate in accordance with the prior art.
Figure 2:
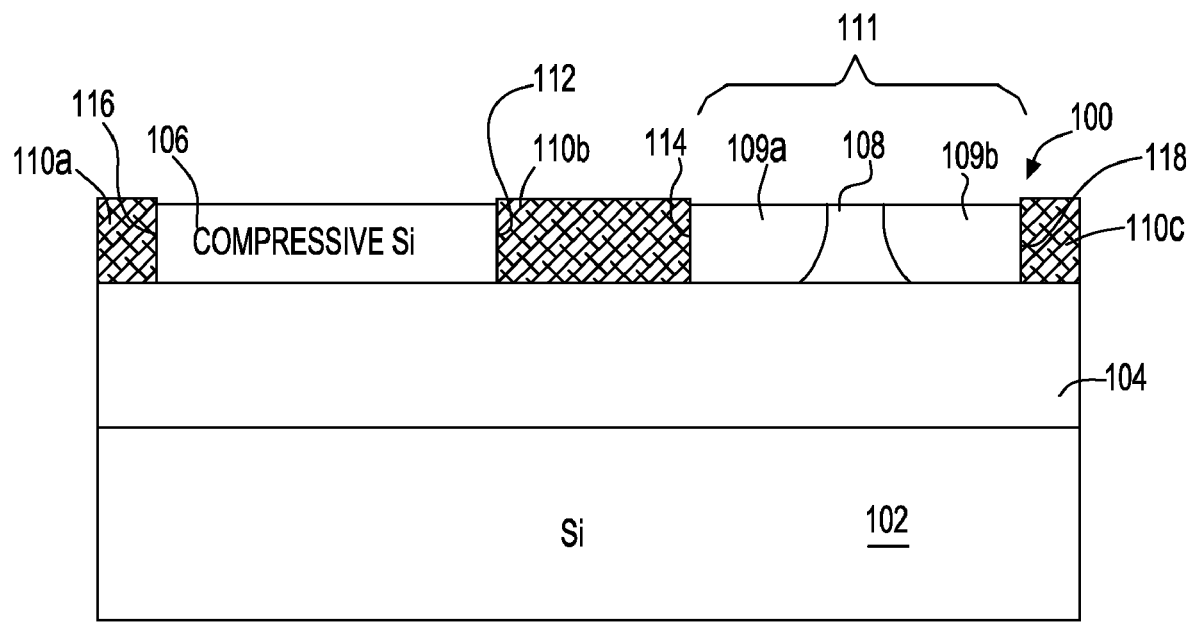
FIG. 2 is a sectional view illustrating a stressed SOI substrate in accordance with one embodiment of the invention.

An SOI substrate 100 according to a first embodiment of the invention is illustrated in FIG. 2. As illustrated therein, the SOI substrate includes a bulk semiconductor region 102, over which a buried oxide ("BOX") layer 104 is provided which includes a flowable dielectric material, for example, a doped silicate glass or other flowable dielectric material. Doped silicate glasses typically are doped with one or both of boron or phosphorous. Borosilicate glass ("BSG") refers to such glass doped with boron, phosphosilicate glass ("PSG") refers to such glass doped with phosphorus and borophosphosilicate glass ("BPSG") refers to such glass doped with both boron and phosphorus. The bulk semiconductor region 102 consists essentially of monocrystalline silicon, for example. In a particular embodiment, the BOX layer includes a layer consisting essentially of BSG as the flowable dielectric material.

As further shown in FIG. 2, an SOI layer of the substrate includes a region 106 of compressive stressed monocrystalline silicon overlying the BOX layer 104. The compressive stressed region 106 provides a first active semiconductor region of the substrate. The SOI layer further includes a region 108 of tensile stressed monocrystalline silicon overlying the BOX layer 104. Two additional regions 109a and 109b of compressive stressed monocrystalline silicon adjoin the region 108 of tensile stressed silicon. Together, the tensile stressed region 108 and the compressive stressed regions 109a, 109b form a second active semiconductor region 111 of the substrate.

The BOX layer 104 separates the stressed silicon regions 106, 108, 109a and 109b from the bulk semiconductor region 102. A trench isolation region 110b is disposed between a first peripheral edge 112 of active semiconductor region 106 and a first peripheral edge 114 of active semiconductor region 111. That trench isolation region 110b electrically isolates the active semiconductor regions 106, 111 from each other. Another trench isolation region 110a is disposed adjacent to another peripheral edge 116 of the active semiconductor region 106, such edge 116 being opposite the first peripheral edge 112. Another trench isolation region 110c is disposed adjacent to another peripheral edge 118 of the active semiconductor region 111, such edge being opposite the first peripheral edge 114 of that active semiconductor region 111. The two trench isolation regions 110a, 110b disposed laterally adjacent to the compressive stressed active semiconductor region 106 serve to hinder the stress from relaxing therein, such that compressive stress having a desirably high magnitude is maintained in the active semiconductor region 106. Similarly, the two trench isolation regions 110b, 110c disposed laterally adjacent to the active semiconductor region 111 serve to hinder the stress from relaxing in the stressed silicon region 111, such that tensile stress having a desirably high magnitude is maintained in the tensile stressed region 108 of the active semiconductor region 111.

A subsequent stage of fabrication is illustrated in FIG. 3, after further fabrication steps are performed to form a PFET 120 having a channel region 122, a source region 123 and a drain region 125 disposed within the compressive stressed active semiconductor region 106. A gate conductor stack of the PFET includes a gate 124 including semiconductive and/or conductive material, which is separated from the channel region 122 by a gate dielectric 126. A low-resistance layer 129 including a metal, a metal compound or both, such as a conductive silicide contacts the source and drain regions 123, 125 for enhanced conductivity. Dielectric spacers 128 typically are provided on sidewalls of the gate 124, particularly when the low-resistance layer 129 is provided.

FIG. 3 further illustrates an NFET 130 having a channel region 132 disposed within the tensile stressed silicon region 108. The NFET has a source region 133 and a drain region 135 disposed within the two compressive stressed silicon regions 109a, 109b, respectively, the compressive stressed silicon regions 109a, 109b having edges 136 in common with the tensile stressed silicon region 108. The NFET 130 also has a gate conductor stack 134, as well as a low-resistance layer 131 and dielectric spacers 138 contacting edges 139 of the gate conductor stack 134. The gate conductor stack 134 of the NFET 130 is registered with the tensile stressed region 108 in the active semiconductor region. However, the edges 134 of the gate conductor stack 134 may not be aligned with the edges 136 of the compressive stressed region.

In most silicon-on-insulator and bulk silicon substrates, the direction of current flow in the channel of an FET transistor is in the <110> crystal orientation. In such substrates, the performance of a field effect transistor ("FET") benefits when a beneficial stress is applied to the channel region of the FET in the direction of current flow in the channel between the source and drain. The performance of a p-type FET or "PFET" benefits the most when compressive stress is applied to the channel region in the direction of the current flow between the source and drain. The performance of an n-type FET or "NFET" benefits the most when tensile stress is applied to the channel region in the direction of the current flow between the source and drain.

Owing to the way in which the stressed active semiconductor regions in the SOI substrate are fabricated, the channel region of each FET desirably has a large stress near an exposed major surface (typically a top surface) of the SOI layer, i.e., the surface of the SOI layer which is contacted by the gate dielectric 126. The magnitude of the stress desirably peaks near that exposed major surface of the SOI layer. Moreover, the magnitude of the stress typically falls within the channel region in a direction (typically downwardly direction) from the major surface of the SOI layer towards a bottom surface of the SOI layer adjacent to the BOX layer. The stress magnitude may be much lower, for example: three to 300 times or more lower at the bottom surface of the SOI layer than at the major surface. The stress at the bottom surface may even be of the opposite polarity than the stress at the exposed major surface. For example, the stress may be compressive near the exposed major surface and tensile near the bottom surface, or the stress may be tensile near the exposed major surface and compressive near the bottom surface. In addition, the magnitude of the stress within the channel region desirably is uniform in a longitudinal direction of the FET, i.e., in a direction of current flow between the source region and the drain region across the channel region of the FET. Desirably, the magnitude of the stress is also mostly uniform in the transverse direction (direction of the width of the channel region), the stress magnitude typically falling at opposite transverse edges of the channel region.

In the foregoing example, an SOI substrate includes both compressive stressed and tensile stressed active semiconductor regions. PFETs are provided which have channel regions disposed in the compressive stressed regions. NFETs are provided which have channel regions disposed in the tensile stressed regions. However, in an alternative embodiment, both NFETs and PFETs need not be present on the same substrate. Some types of integrated circuits utilize NFETs or PFETs exclusively. For example, a dynamic random access memory ("DRAM") typically utilizes NFETs exclusively as array transistors.

In addition, both types of transistors need not be provided in stressed semiconductor regions having the corresponding most beneficial type of stress. Thus, a substrate can be fabricated to contain active semiconductor regions which have compressive stress but without active semiconductor regions that have tensile stress. In such case, PFETs can be provided which have channel regions disposed in the compressive stressed regions. Some NFETs may also be provided which have channel regions in the compressive stressed regions of the substrate. However, it is recognized that NFETs fabricated in this way may incur a degradation of performance. Such substrate may also include active semiconductor regions which have neutral stress, in which case, NFETs may be provided in neutral stress regions without incurring performance degradation to the same degree.

Alternatively, a substrate can be fabricated to contain active semiconductor regions which have tensile stress but without active semiconductor regions that have compressive stress. In such case, desirably NFETs are provided which have channel regions in the tensile stress regions. Neutral stress regions may be provided also in such substrate, and PFETs be provided therein. Alternatively, only tensile stressed regions can be provided, and both NFETs and PFETs can be provided which have channel regions disposed in the tensile stressed regions.

There are many ways to impart additional stress to the channel region of the FET. Among these ways are embedding a semiconductor alloy in regions of the transistor adjacent to the channel region. For example, embedded regions of silicon germanium can be provided in the source and drain regions adjacent to the channel region to apply compressive stress to the channel region. Alternatively, embedded regions of silicon carbon can be provided in the source and drain regions adjacent to the channel region to apply tensile stress to the channel region.

FIG. 4 illustrates another way in which additional stress can be imparted to the channel regions of FETs. Specifically, FIG. 4 illustrates a variation of the embodiment described above with reference to FIG. 3, wherein stressed dielectric liners 140 and 142 are provided overlying the source and drain regions of the PFET 120 and the NFET 130. Preferably, a compressive stressed dielectric liner 140 overlies the PFET 120, such liner serving to enhance the compressive stress applied to the channel region 122 of the PFET. Similarly, a tensile stressed dielectric liner 142 preferably overlies the NFET 130, such liner serving to enhance the tensile stress applied to the channel region 132 of the NFET. Generally, as illustrated in FIG. 4, the stressed dielectric liners 140, 142 are provided such that one stressed liner 140 overlaps the other stressed liner 142 where the two stressed liners overlie the trench isolation region 110b. Alternatively, the edges of the stressed dielectric liners 140, 142 can be spaced apart such that neither one of the stressed dielectric liners overlaps the other.

Figure 5:
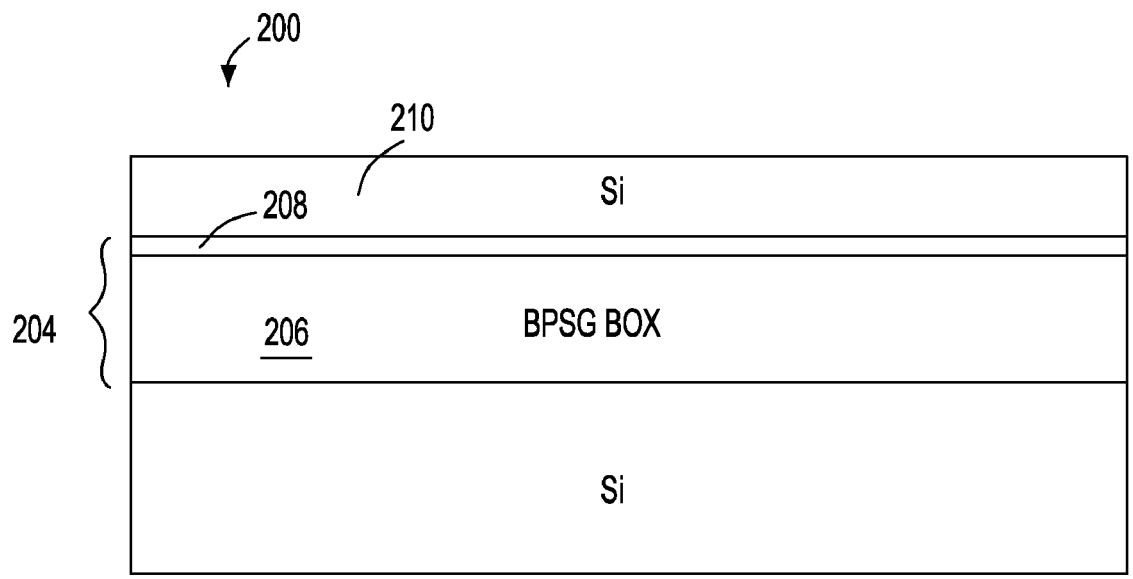
FIGS. 5-10 are sectional views illustrating stages in a process of fabricating a stressed SOI substrate in accordance with one embodiment of the invention.

Referring to FIG. 5, a method will now be described for fabricating the SOI substrate illustrated in FIG. 2. FIG. 5 illustrates a preliminary stage of fabrication in which an SOI substrate 200 is provided which has a buried dielectric layer 204 which includes a flowable dielectric layer 206. Such dielectric layer may consist essentially of doped silicate glass, for example. Illustratively, layer 206 is doped with boron and phosphorus, such that it consists essentially of borophosphosilicate glass ("BPSG"). References herein and in the drawings to a BPSG layer are provided as illustrative examples, as other suitable flowable dielectric materials can be used for this purpose.

The BOX layer 204 overlies a bulk semiconductor region 202 of the substrate, and a silicon-on-insulator ("SOI") layer of monocrystalline silicon 210 overlies the BOX layer 204. Preferably, the dopant concentrations of boron and phosphorus are sufficiently high to give the BPSG layer a relatively low melting temperature. However, the dopant concentrations are not so high that the BPSG layer would begin to flow at temperatures of about 400 degrees C. at which a silicon nitride film 212 (FIG. 6) is subsequently deposited.

As illustrated in FIG. 5, preferably, a layer 208 of undoped silicon oxide is disposed between the BPSG layer 206 and the SOI layer 210. Such layer 208 acts to diminish the concentrations of boron and phosphorus in the monocrystalline SOI layer 210 that might result from diffusion of these dopants from the BPSG layer 206 into the monocrystalline silicon layer 210 during later stages of fabrication. Hereinafter, references to BOX layer 204 should be understood as referring to both BPSG layer 206 and the optional undoped oxide layer 208 when provided in the substrate.

Typically, the SOI substrate 200 is provided by depositing a layer of BPSG to overlie a bulk silicon region of a first wafer, usually referred to as a "handle wafer", and thereafter depositing the optional undoped oxide layer to overlie the BPSG layer. The handle wafer is then bonded with the undoped oxide layer facing a monocrystalline semiconductor region of a second wafer which is referred to as a "bond wafer." After bonding, a relatively thin (e.g., 50 nm to 200 nm thick) monocrystalline SOI layer of the bond wafer is separated from the rest of the bond wafer in a process which can include one or more known techniques such as the known "smart cut" technique, resulting in the wafer structure as shown in FIG. 5.

Alternatively, the bond wafer can be ground and polished from the back side such that only the thin SOI layer remains.

Figure 6:
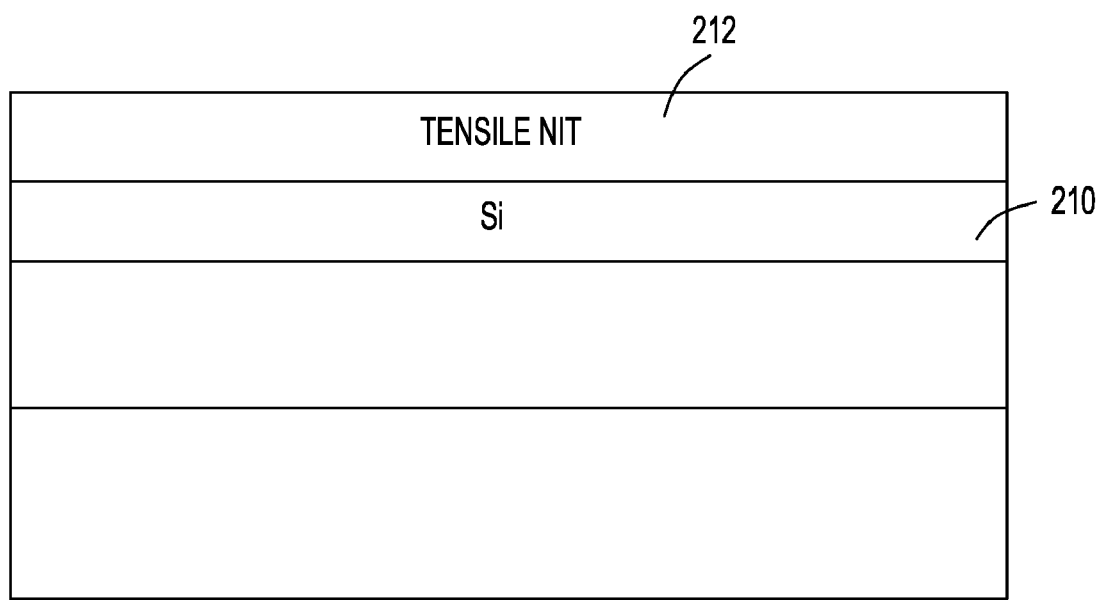

Thereafter, in the stage of fabrication illustrated in FIG. 6, a layer 212 including an internally stressed material is deposited to overlie the SOI layer 210. The layer can include, for example, a layer of silicon nitride, which when deposited under appropriate conditions, retains an internal stress after deposition. In the example illustrated in FIG. 6, a layer 212 of tensile stressed silicon nitride is formed to overlie the SOI layer 210. As deposited, the tensile stressed silicon nitride preferably has a stress of about 1.2 GPa or greater.

Figure 7:
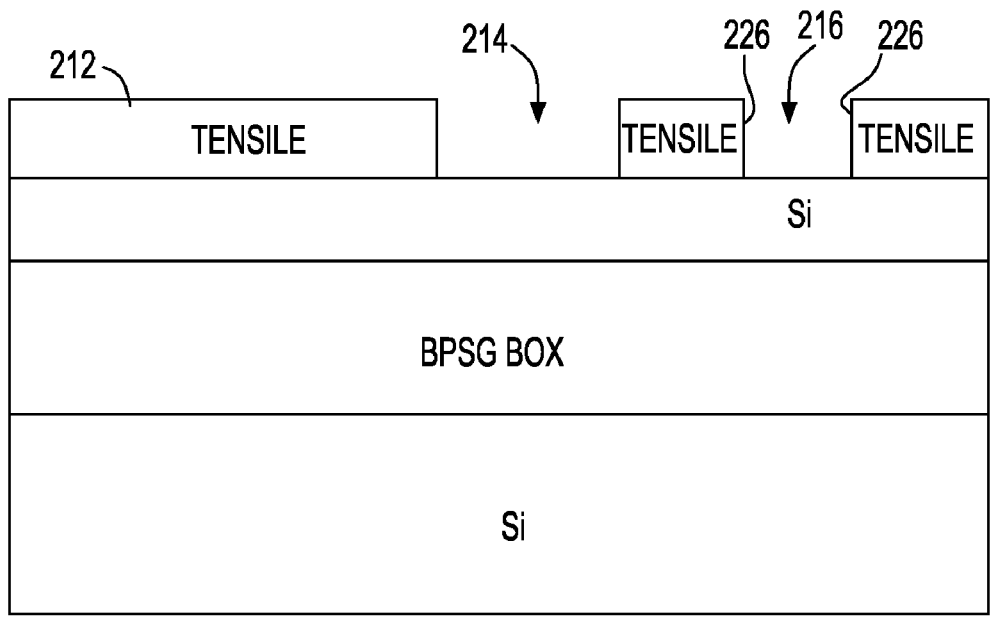

Thereafter, in the stage of fabrication illustrated in FIG. 7, the layer 212 of tensile nitride is patterned, e.g., by photolithographically patterning a photo-imageable mask layer such as photoresist and forming openings 214 and 216 in the tensile-stressed layer 212 in accordance with the patterned mask layer. The openings in the tensile-stressed nitride layer can be formed by selective etching, for example. Desirably, the opening 216 is made sufficiently wide such that there is a space between each internal edge 226 of the opening 216 and the expected location of the adjacent (nearest) edge 139 (FIG. 3) of the subsequently formed gate conductor 134. In an exemplary embodiment, the distance between each internal edge 226 and the expected location of the adjacent edge 139 of the gate conductor 134 is about 50 nanometers (nm). In this way, it is desirable to achieve a sufficient process window such that the entire length of the conduction channel in the finished FET 130 will be within the compressive stressed region 108, despite misalignment that can occur during subsequent gate processing. Then, the photoimageable mask layer is removed, leaving the structure as illustrated in FIG. 7.

Figure 8:
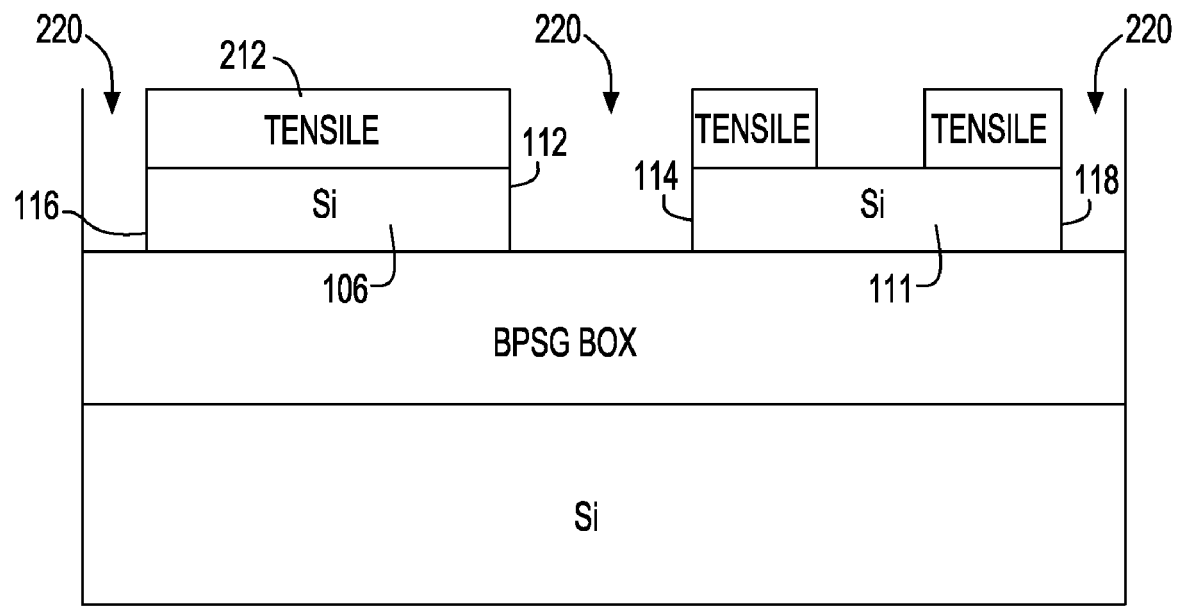

Thereafter, as illustrated in FIG. 8, a photoimageable layer (not shown) is photolithographically patterned to form a mask layer (not shown) and the pattern defined by the mask layer is transferred to the sacrificial tensile stressed layer 212 and the underlying SOI layer to define a first active semiconductor region 106 having peripheral edges 112, 116 and a second active semiconductor region 111 having peripheral edges 114 and 118, with trenches 220 adjacent to the peripheral edges of each active semiconductor region.

Figure 9:
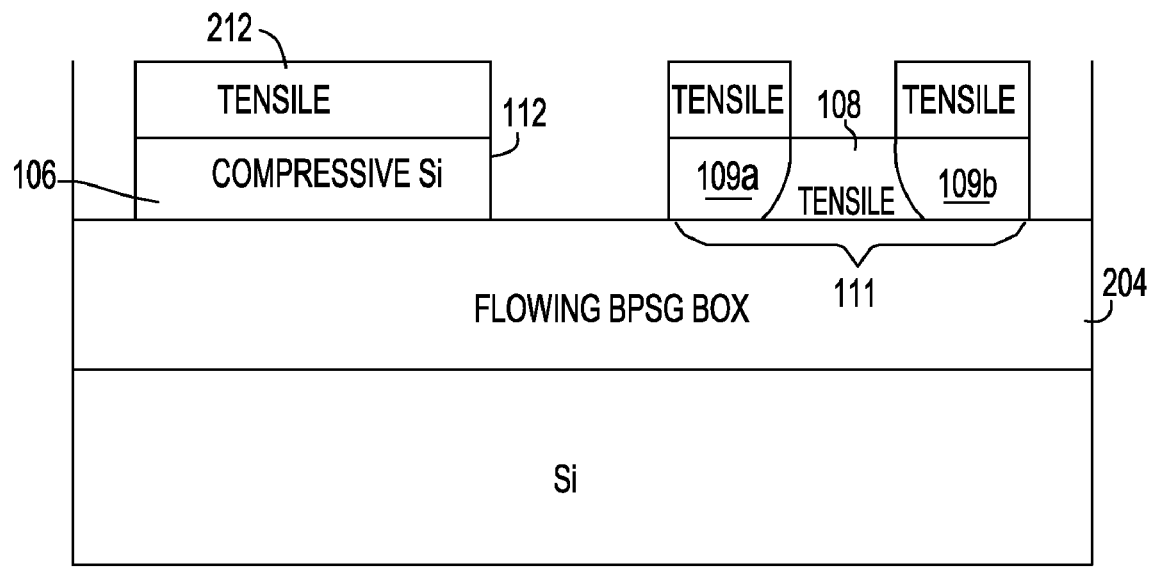

Referring to FIG. 9, thereafter, the substrate including the stressed layer 212 thereon is elevated to a temperature at which the flowable dielectric material within the BOX layer 204 softens. Such temperature needs to be below a temperature which would directly cause the material properties of the stressed layer 212 to change. When the stressed layer consists essentially of tensile stressed silicon nitride, the temperature can be up to about 1000 degrees C. without causing the material properties of the tensile stressed silicon nitride layer to worsen significantly.

As the flowable dielectric material of the BOX layer softens, it becomes pliable. The pliability of the material permits the stresses in the overlying stressed layer 212 and the active semiconductor regions 106, 111 to move closer to equilibrium. As a result, the tensile stress within the tensile stressed layer 212 tends to relax, causing the underlying active semiconductor region 106 to become a compressive stressed silicon region.

Similarly, first portions of the active semiconductor region 111 which directly underlie the tensile stressed layer become compressive stressed silicon regions 109a and 109b. However, a different result obtains in area 108 of the active semiconductor region 111 which does not directly underlie the tensile stressed layer 212. Here, area 108 becomes tensile stressed when the BOX layer 204 softens due to heating the substrate. Area 108 becomes tensile stressed as a result of its relationship and proximity to the tensile stressed layer 212. It is not uncommon for a tensile stress of 0.5 GPa to about 1.5 GPa or greater to be achieved in the active conduction channel of the FET near a major surface of the channel region in contact with a gate dielectric of the FET.

Figure 10:
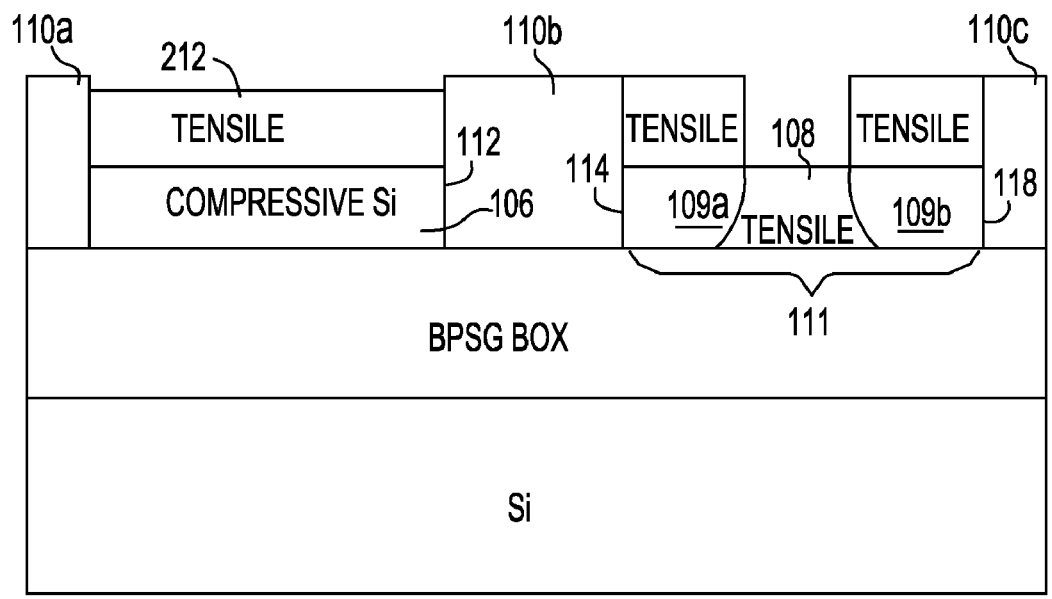

Thereafter, in a subsequent stage of fabrication illustrated in FIG. 10, trench isolation regions 110a, 110b and 110c are formed. Illustratively, the trench isolation regions are formed by depositing a layer of oxide, e.g., by a high density plasma deposition, or from a tetraethylorthosilicate ("TEOS") precursor, silane ($Si_4$), spin-on-glass, or other suitable method, and then removing excess oxide material which overlies the tensile stressed layer 212, such as by an etchback process or CMP. The trench isolation regions can be described as "shallow trench isolation" ("STI") regions, such STI regions typically extending to a depth from the major surface of the SOI layer which is about the same as a thickness of the SOI layer above the BOX layer. During the formation of the STI regions, the active semiconductor regions 106, 111 continue to remain stressed because the stressed layer 212 remains in place overlying them.

As further shown in FIG. 10, one trench isolation region 110b occupies an opening between an edge 112 of the compressive stressed active semiconductor region 106 and the adjacent edge 114 of the compressive stressed active semiconductor region 109a. Additional trench isolation regions 110a, 110c are disposed at other peripheral edges 116 and 118 of the stressed active semiconductor regions 106, 111, respectively. With these trench isolation regions now in place, the stresses within each of the active semiconductor regions 106 and 111 (including within each individual region 108, 109a and 109b) are essentially "locked in"; i.e., essentially fixed. The stressed layer 212 then is removed from over the active semiconductor regions 106, 111 to result in the substrate 100 shown in FIG. 2. The stressed layer 212 can be removed, for example, by performing etching or cleaning processes or both in a manner selectively to the underlying silicon material in the stressed semiconductor regions 106, 111. Desirably, the removal process reduces the height of the trench isolation regions 110a, 110b, 110c, such that tops of the trench isolation regions are about even with exposed surfaces of the active semiconductor regions 106, 111.

Desirably, once the STI regions are fully formed and the stressed layer 212 is removed, subsequent processing does not cause the stress levels in the active semiconductor regions to decrease much. Desirably, the thermal budget of subsequent processing used to complete the fabrication of a chip including FETs, interconnects thereto, etc., is designed, i.e., constrained such that the BOX layer does not relax again after the stressed layer 212 is removed. In cases where the thermal budget of subsequent processing may be high enough to cause the BOX layer to relax, the STI regions exert stabilizing forces which limit expansion or contraction of the active semiconductor regions 106, 111. In such way, the STI regions help to prevent the stress levels in the active semiconductor regions from decreasing due to relaxation during subsequent processing.

In one variation of the above embodiment, the sacrificial tensile stressed layer 212 (FIG. 6) includes a layer of tensile stressed silicon carbon instead of or in addition to a layer of silicon nitride. The layer of silicon carbon desirably is grown epitaxially from an exposed surface of the monocrystalline SOI layer 210. A layer including tensile stressed silicon nitride may be deposited to overlie the layer of silicon carbon. The BOX layer desirably consists essentially of phosphosilicate glass ("PSG") rather than BPSG. PSG has a higher reflow temperature which is desirable to permit the layer of silicon carbon to be grown without causing the PSG layer to reflow at that temperature. Later in the fabrication process (FIG. 9), the PSG layer is reflowed at a temperature such as, for example, a temperature ranging between about 750 and about 900 degrees C.

Figure 11:
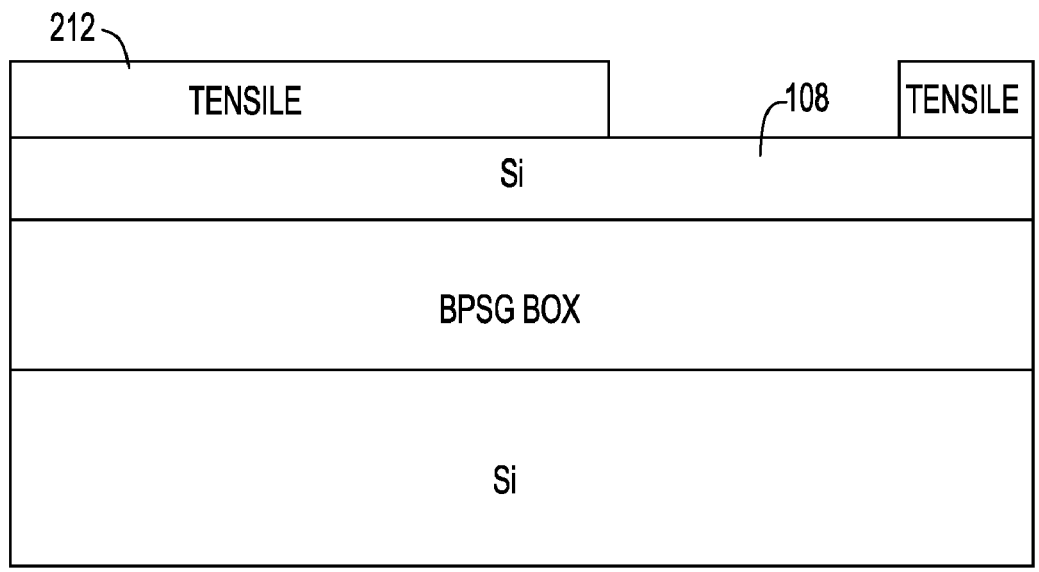
FIG. 11 is a sectional view illustrating a stage in a process of fabricating a stressed SOI substrate in accordance with a variation of the embodiment shown in FIGS. 5-10.

In a particular variation of the above embodiment (FIG. 11), when the tensile stressed layer 212 is patterned initially, only the portion of the tensile stressed layer 212 which overlies the area 108 is removed prior to the step of etching the trenches 220 (FIG. 8) into the SOI layer. In such way, the process of etching the trenches 220 in the SOI layer aligns edges of the tensile stressed layer 212 exposed by the trenches with the edges 112, 114 of the tensile stressed layer such that there is no misregistration between the edges of the tensile stressed layer and the SOI layer.

Figure 12:
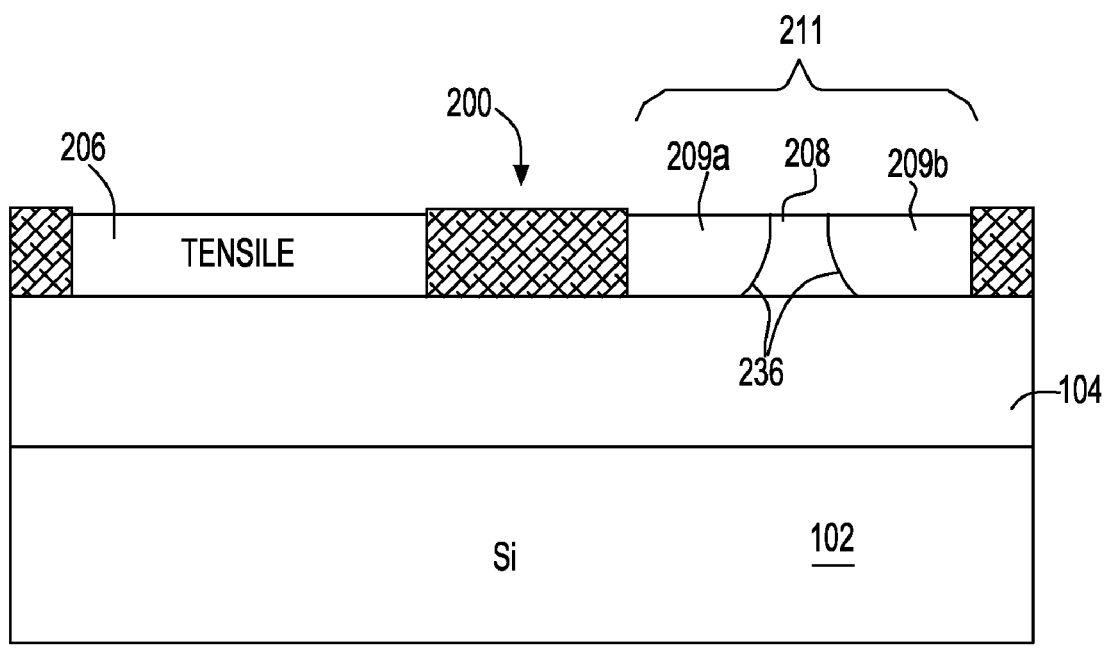
FIG. 12 is a sectional view illustrating a stressed SOI substrate in accordance with one embodiment of the invention.

An SOI substrate 200 according to a second embodiment of the invention is illustrated in FIG. 12. This embodiment of the invention varies from the SOI substrate according to the embodiment of the invention described above with respect to FIG. 2 in that the SOI substrate 200 includes a first active semiconductor region 206 including a region of tensile stressed monocrystalline silicon overlying the BOX layer 104. The SOI layer further includes a second active semiconductor region 211. The second active semiconductor region 211 includes an interior compressive stressed monocrystalline silicon region 208 and tensile stressed monocrystalline silicon regions 209a, 209b. The tensile stressed silicon regions have edges 236 in common with the compressive stressed silicon region 208.

Figure 13:
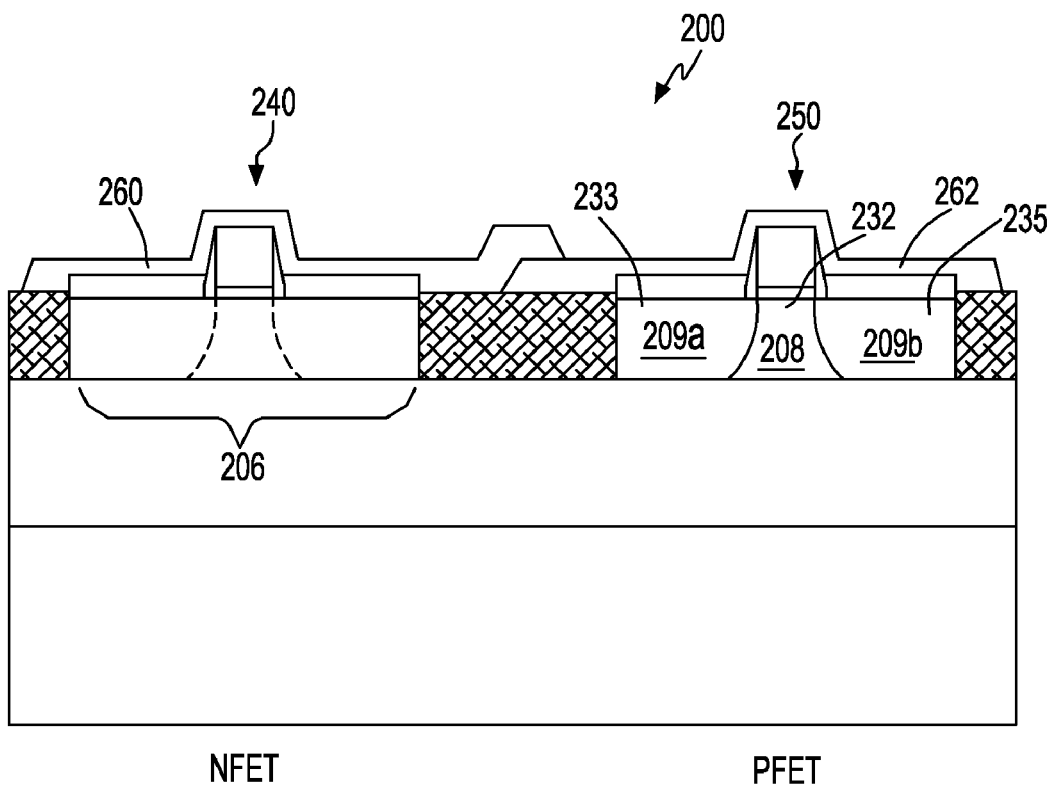
FIG. 13 is a sectional view illustrating FETs provided in a stressed SOI substrate in accordance with an embodiment of the invention.

In an exemplary embodiment (FIG. 13), a PFET 250 can be fabricated in the SOI substrate 200 to include a channel region 232 disposed in the compressive stressed interior region 208 of the active semiconductor region 211. A source region 233 of the PFET can be provided in a first one of the tensile stressed regions 209a or 209b of the active semiconductor region and a drain region 235 can be provided in one of the tensile stressed regions 209a or 209b other than the first one. An NFET 240 can also be provided which has a source region, a drain region and a channel region disposed in the tensile stressed active semiconductor region 206. Optionally, one dielectric liner 260 having a beneficial stress, e.g., a liner including silicon nitride having tensile stress can be provided overlying an NFET, for example, to further increase the tensile stress applied to the channel region of such NFET. Optionally, a second dielectric liner 262 having a compressive stress can be provided overlying a PFET to further increase the compressive stress applied to the channel region of such PFET. Such one or more tensile stressed or compressive stressed dielectric liners can be used in combination with an NFET or a PFET or both. A tensile stressed liner need not be used only in combination with a PFET but can be used in combination with an NFET instead or in addition thereto. A compressive stressed liner need not be used only in combination with an NFET but can be used in combination with a PFET instead or in addition thereto.

Figure 14:
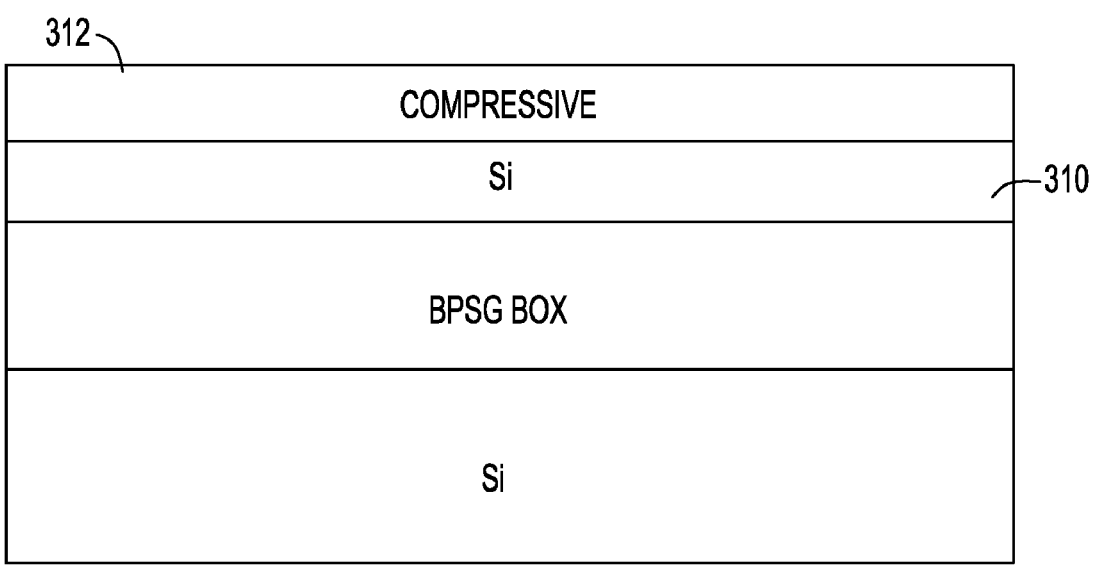
FIGS. 14-17 are sectional views illustrating stages in a process of fabricating a stressed SOI substrate in accordance with one embodiment of the invention.
Figure 15:
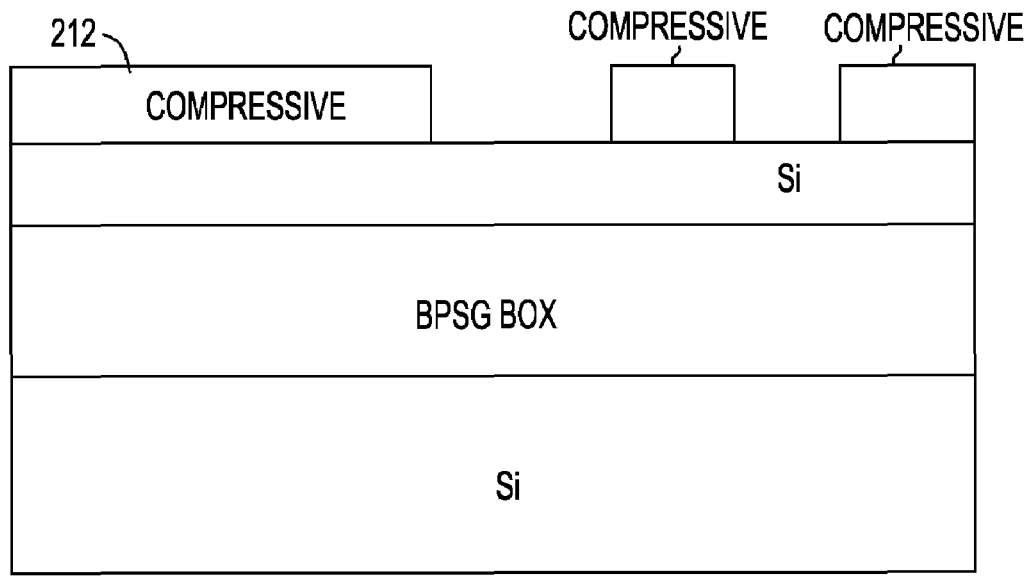
Figure 16:
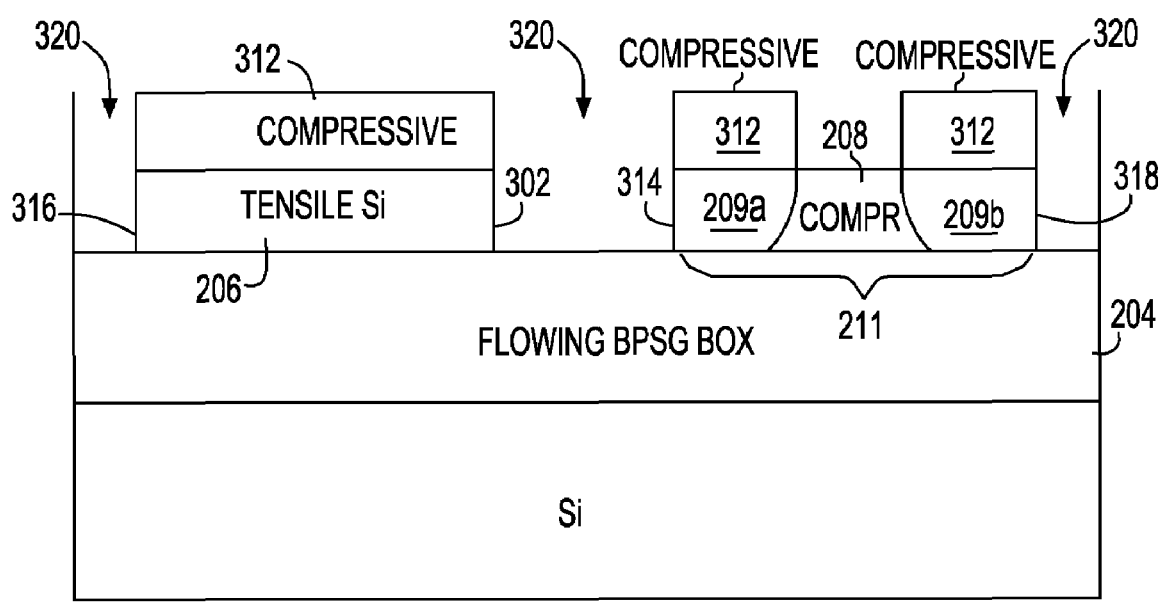

Fabrication of the SOI substrate 200 is similar to that of the SOI substrate 100 described above, with the exception that the sacrificial stressed layer 312 (FIG. 14) has compressive stress. As deposited, when the sacrificial stressed layer 312 consists essentially of stressed silicon nitride, it has a compressive stress having a magnitude of between about 3.0 and 3.5 GPa. Similar to the above-illustrated embodiment, the compressive stressed layer 312 is patterned (FIG. 15) in accordance with a mask layer (not shown), after which trenches 320 (FIG. 16) are etched which extend through the SOI layer to the BOX layer. In that way, the walls of the trenches 320 define the peripheral edges 302, 314, 316 and 318 of active semiconductor regions 206, 211.

Thereafter, when the substrate is heated to a temperature sufficient to cause the BPSG layer 204 to soften, for example, to a temperature of about 600 degrees centigrade, the softened BPSG layer 204 allows the stress in portions 206, 208, 209a, and 209b of the SOI layer to change due to the stresses applied thereto by the sacrificial compressive stressed layer 312. Portions 206, 209a, 209b of the SOI layer in direct contact with the sacrificial stressed layer 312 become increasingly tensile stressed as the stress in those portions tends towards establishing equilibrium with the compressive stress applied thereto by the sacrificial stressed layer 312. On the other hand, the portion 208 of the SOI layer which is not in direct contact with the sacrificial stressed layer 312 is affected by the tensile stress that now exists in portions 209a, 209b of active semiconductor region 211. Under such conditions, portion 208 now acquires significant compressive stress, e.g., a compressive stress having a magnitude of about 1.5 GPa to 2.0 GPa or greater near an exposed major surface of the portion 208.

In one variation of the above embodiment, the sacrificial compressive stressed layer 312 (FIG. 14) includes a layer of compressive stressed silicon germanium instead of or in addition to a layer of compressive stressed silicon nitride. The layer of silicon germanium desirably is grown epitaxially from an exposed surface of the monocrystalline SOI layer 310. A layer including compressive stressed silicon nitride may be deposited to overlie the layer of silicon carbon. The BOX layer desirably consists essentially of phosphosilicate glass ("PSG") rather than BPSG. PSG has a higher reflow temperature which is desirable to permit the layer of silicon germanium to be grown without causing the PSG layer to reflow at that temperature. Later in the fabrication process (FIG. 16), the PSG layer is reflowed at a higher temperature, e.g., 750 to 900 degrees C., than that at which the BPSG layer is reflowed.

Figure 17:
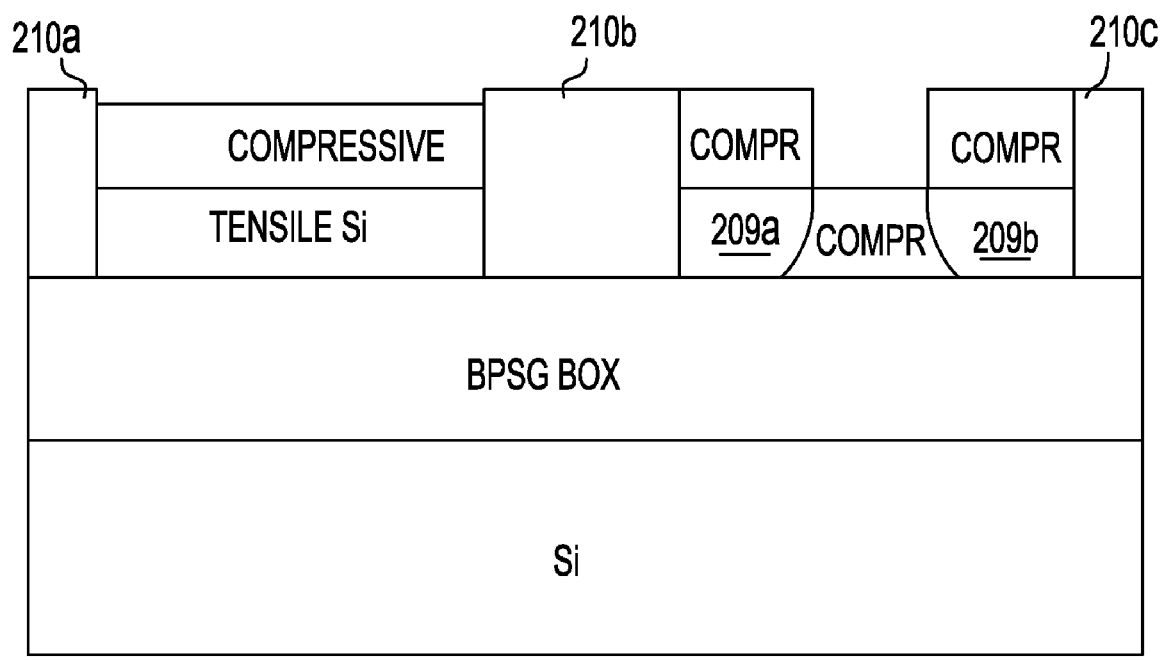

After filling the trenches with a dielectric material to form STI regions 210a, 210b and 210c (FIG. 17) in like manner to the process described above (FIG. 10), the sacrificial compressive stressed layer is removed together with upper portions of the STI regions to produce the SOI substrate 200 illustrated in FIG. 12.

In view of the foregoing variations of embodiments of the invention shown and described herein, it will be understood that many modifications and enhancements can be made without departing from the true scope and spirit of the present invention. It is intended by the claims appended below to cover all such modifications and enhancements.

What is claimed is:

1. A method of fabricating a field effect transistor ("FET") having a channel region in a semiconductor-on-insulator ("SOI") substrate including (i) an SOI layer of monocrystalline silicon separated from (ii) a bulk semiconductor layer by (iii) a buried oxide dielectric layer including a flowable dielectric material, the method comprising:
   a) forming a sacrificial stressed layer overlying a first portion of an active semiconductor region, the stressed layer not overlying a second portion of the active semiconductor region having a common boundary with the first portion;
   b) forming trenches extending through the stressed layer into the SOI layer, the walls of the trenches defining peripheral edges of the active semiconductor region;
   c) heating the SOI substrate with the stressed layer thereon sufficiently to cause the stressed layer to relax, thereby causing the stressed layer to apply a first stress to the first portion and to apply a second stress to the second portion, the first stress being one of tensile or compressive, the second stress being one of tensile or compressive other than the first stress;
   d) depositing a dielectric material in the trenches to form isolation regions contacting the peripheral edges of the stressed active semiconductor region, the isolation regions extending from a major surface of the stressed SOI layer towards the BOX layer;
   e) removing the stressed layer to expose the first and second portions of the active semiconductor region; and
   f) forming a field effect transistor ("FET") to include (i) a source region in the first portion, (ii) a drain region in the first portion, and (iii) a channel region in the second portion.

2. The method as claimed in claim 1, wherein the flowable dielectric material includes a doped silicate glass.

3. The method as claimed in claim 1, wherein the doped silicate glass includes borophosphosilicate glass.

4. The method as claimed in claim 1, wherein the stressed layer is formed by depositing a stressed layer over the active semiconductor region and removing a portion of the stressed layer in registration with the second portion.

5. The method as claimed in claim 1, wherein the FET has a p-type conduction channel, the first stress applied to the first portion by the step (c) of heating includes tensile stress and the second stress applied to the second portion by the step (c) of heating includes compressive stress.

6. The method as claimed in claim 5, wherein the stressed layer includes silicon germanium.

7. The method as claimed in claim 5, wherein the stressed layer includes compressive stressed silicon nitride.

8. The method as claimed in claim 5, wherein the active semiconductor region is a first active semiconductor region and the sacrificial stressed layer is formed to overlie a second active semiconductor region, by the step (c) of heating the SOI substrate with the stressed layer thereon causes the stressed layer to apply the first stress to the second active semiconductor region, and the step of removing the sacrificial stressed layer includes removing the sacrificial stressed layer overlying the second active semiconductor region, the method further comprising forming an n-type FET ("NFET") having a source region, a drain region and channel region in the second active semiconductor region, the second active semiconductor region having an internal tensile stress.

9. The method as claimed in claim 1, wherein the FET has an n-type conduction channel, the first stress applied to the first portion by the step (c) of heating includes compressive stress and the second stress applied to the second portion by the step (c) of heating includes tensile stress.

10. The method as claimed in claim 9, wherein the stressed layer includes silicon carbide.

11. The method as claimed in claim 9, wherein the stressed layer includes tensile stressed silicon nitride.

12. The method as claimed in claim 9, wherein the active semiconductor region is a first active semiconductor region and the sacrificial stressed layer is formed to overlie a second active semiconductor region, by the step (c) of heating the SOI substrate with the stressed layer thereon causes the stressed layer to apply the first stress to the second active semiconductor region, and the step of removing the sacrificial stressed layer includes removing the sacrificial stressed layer overlying the second active semiconductor region, the method further comprising forming a p-type FET ("PFET") having a source region, a drain region and channel region in the second active semiconductor region, the second active semiconductor region having an internal compressive stress.

13. The method of fabricating an FET as claimed in claim 1, further comprising depositing a stressed dielectric liner to overlie the FET, the stressed dielectric liner increasing a magnitude of stress applied to the channel region of the FET.

14. The method of fabricating an FET as claimed in claim 1, further comprising depositing a stressed dielectric liner to overlie the FET, the stressed dielectric liner decreasing a magnitude of stress applied to the channel region of the FET.

15. A method of fabricating field effect transistors ("FETs") having different conductivity types, the FETs having channel regions disposed in a monocrystalline silicon-on-insulator ("SOI") layer of an SOI substrate, the SOI substrate including (i) the SOI layer separated from (ii) a bulk semiconductor layer by (iii) a buried dielectric layer including a flowable dielectric material, the method comprising:
  a) forming a sacrificial stressed layer overlying a first portion and a third portion of an active semiconductor region, the stressed layer not overlying a second portion of the active semiconductor region, the second portion having a common boundary with the first portion;
  b) forming trenches extending through the stressed layer into the SOI layer, the walls of the trenches defining edges of the active semiconductor region;
  c) heating the SOI substrate with the stressed layer thereon sufficiently to cause the stressed layer to relax, thereby causing the stressed layer to apply a first one of tensile stress or compressive stress to the first portion, to apply the first one of tensile stress or compressive stress to the third portion and to apply a second stress to the second portion, the second stress being one or tensile or compressive other than the first stress,
  d) depositing a dielectric material in the trenches to form isolation regions contacting the edges of the stressed active semiconductor region, the isolation regions extending from a major surface of the stressed SOI layer towards the BOX layer;
  e) removing the stressed layer to expose the first, second and third portions of the active semiconductor region; and
  f) forming a first field effect transistor ("FET") and a second FET, the first FET including (i) a source region disposed in the first portion, (ii) a drain region disposed in the first portion, and (iii) a channel region disposed in the second portion, the second FET including a second source region disposed in the third portion, a second drain region disposed in the third portion and a second channel region disposed in the third portion.

16. The method as claimed in claim 15, wherein the flowable dielectric material includes doped silicate glass.

17. The method as claimed in claim 15, wherein the stressed layer is formed by depositing a stressed layer over the active semiconductor region and removing a portion of the stressed layer in registration with the second portion.

18. The method as claimed in claim 15, wherein the first FET has a p-type conduction channel and the second FET has an n-type conduction channel, the first stress applied to the first portion and the third portion by the step (c) of heating includes tensile stress and the second stress applied to the second portion by the step (c) of heating includes compressive stress.

19. The method as claimed in claim 15, further comprising depositing a stressed dielectric liner to overlie at least one of the first and second FETs, the stressed dielectric liner increasing a magnitude of stress applied to the channel region of the at least one FET.

20. The method of fabricating an FET as claimed in claim 15, further comprising depositing a stressed dielectric liner to overlie at least one of the first and second FETs, the stressed dielectric liner decreasing a magnitude of stress applied to the channel region of the at least one FET.

* * * * *